(12) United States Patent
Kajouke

(10) Patent No.: US 8,289,033 B2
(45) Date of Patent: Oct. 16, 2012

(54) SYSTEMS AND METHODS FOR DETECTING RESONANCE ON A DIRECT CURRENT VOLTAGE BUS

(75) Inventor: Lateef A. Kajouke, San Pedro, CA (US)

(73) Assignee: GM Global Technology Operations LLC, Detroit, MI (US)

( * ) Notice: Subject to any disclaimer, the term of this patent is extended or adjusted under 35 U.S.C. 154(b) by 663 days.

(21) Appl. No.: 12/358,886

(22) Filed: Jan. 23, 2009

(65) Prior Publication Data
US 2010/0188071 A1    Jul. 29, 2010

(51) Int. Cl.
G01R 27/04    (2006.01)
G01R 23/02    (2006.01)
H02M 7/44     (2006.01)
(52) U.S. Cl. .......................... 324/633; 324/76.39; 363/95
(58) Field of Classification Search .................. 324/633; 363/95, 109
See application file for complete search history.

(56) References Cited

U.S. PATENT DOCUMENTS

| | | | | |
|---|---|---|---|---|
| 4,473,790 A * | 9/1984 | Plunkett et al. | ............... | 318/298 |
| 6,069,809 A * | 5/2000 | Inoshita | ........................... | 363/98 |
| 6,337,801 B2 * | 1/2002 | Li et al. | ........................... | 363/127 |
| 6,483,319 B1 * | 11/2002 | Kendig et al. | ................. | 324/551 |
| 6,870,347 B2 * | 3/2005 | Mizuno et al. | ................. | 318/722 |
| 6,924,618 B2 * | 8/2005 | Matsushiro et al. | .......... | 318/811 |
| 7,084,601 B2 * | 8/2006 | Maeda et al. | ................. | 318/806 |
| 7,576,500 B2 * | 8/2009 | Patel et al. | .................... | 318/139 |
| 7,626,836 B2 * | 12/2009 | Leggate et al. | ................. | 363/41 |
| 2007/0091653 A1 * | 4/2007 | Leggate et al. | ................. | 363/41 |
| 2008/0298785 A1 * | 12/2008 | Patel et al. | .................... | 388/820 |

OTHER PUBLICATIONS

Chinese Office Action, dated Dec. 7, 2011, for Chinese Patent Application No. 201010105834.0.

* cited by examiner

*Primary Examiner* — Timothy J Dole
(74) *Attorney, Agent, or Firm* — Ingrassia Fisher & Lorenz, P.C.

(57) ABSTRACT

Systems and methods are provided for detecting a resonance on a bus coupled to an inverter module. A method involves generating a first signal on the bus with a first frequency and sweeping the first signal from the first frequency to a second frequency. A second signal, which may be influenced by a characteristic of a component coupled to the bus, is obtained from the bus during the sweep of the first signal from the first frequency to the second frequency. The method further involves determining a resonant frequency based on the first signal and the second signal and updating the inverter module such that the resonant frequency is not used as a switching frequency for the inverter module.

20 Claims, 2 Drawing Sheets

SYSTEMS AND METHODS FOR DETECTING RESONANCE ON A DIRECT CURRENT VOLTAGE BUS

TECHNICAL FIELD

Embodiments of the subject matter described herein relate generally to electrical systems in automotive vehicles, and more particularly, embodiments of the subject matter relate to systems and methods for identifying a resonant frequency on a direct current (DC) voltage bus.

BACKGROUND

In recent years, advances in technology, as well as ever evolving tastes in style, have led to substantial changes in the design of automobiles. One of the changes involves the power usage and complexity of the various electrical systems within automobiles, particularly alternative fuel vehicles, such as hybrid, electric, and fuel cell vehicles. Many of the electrical components share a common direct current (DC) voltage bus. The DC voltage bus (alternatively referred to as a high voltage DC bus, a power bus, or an electrical bus) is configured to carry DC power from one or more DC power sources (e.g., a battery) in the vehicle to numerous other electrical components in the vehicle, such as auxiliary power modules, air compressors, power converters, and the like. In addition, a power inverter (or another suitably configured electric motor driver) is often connected to the DC bus and configured to drive the electric motor in the vehicle. The power inverter utilizes several semiconductor switches which are modulated (i.e., opened and closed) at a particular switching frequency to convert DC power from the bus to AC power for driving the electric motor. During operation, the power inverter generates a ripple current (or ripple voltage) at the switching frequency, which in some situations may not be entirely filtered by the power inverter (e.g., by an input capacitor and/or inductor). As a result, the ripple current is transmitted back out on the DC bus and potentially to the one or more of the other components coupled to the bus.

In general, each component coupled to the DC bus has an input filter comprising one or more input capacitors and/or inductors configured to provide specific input impedance which minimizes ripple current or voltage generated by the component. The input filter (e.g., the capacitors and/or inductors) of a respective component is selected to provide attenuation over frequency span suited for the operation of the respective component. The current rating of the input filter (or the ripple current rating of the component) is chosen such that it is not exceeded when the component is coupled to the bus during normal operation, without consideration for other components that may be coupled to the DC bus. This is because the other components are assumed to be configured to minimize the ripple they may generate, such that the total amount of ripple current on the DC bus is negligible.

However, because the input impedance of a particular component may vary with frequency, the component may have a reduced input impedance at a particular frequency. A current on the DC bus at (or near) this particular frequency results in an increased amount of ripple current that is dissipated by the particular component which, in turn, may result in a resonance at the particular frequency. When numerous electrical components, each having a different input filter frequency response, are coupled to the DC bus, the resulting electrical system often has one or more potential resonant frequencies.

In most systems, the power inverter utilizes variable switching frequency for purposes of optimizing one or more aspects of operation of the inverter, for example, to minimize switching losses or minimize torque ripple generated by the electric motor. However, when the switching frequency is changed, the frequency of the ripple current that may potentially be generated by the power inverter also changes. Depending on the switching frequency, the ripple current may produce a resonant current on the DC bus based on the quality factor and bandwidth associated with a particular resonant frequency. This resonant current may exceed the current rating of the input filter for one or more components coupled to the DC bus.

In some systems, the power inverter may be configured to avoid a particular switching frequency to prevent resonance from occurring on the DC bus during operation. However, the characteristics of the other components coupled to the DC bus may vary from vehicle to vehicle (e.g., as a result of individual component tolerances), and would therefore require customizing the power inverter configuration for each vehicle. In addition, the characteristics of the other components coupled to the DC bus may vary over time, for example, as a result of aging or a change of components. Therefore, it is difficult to ensure that the potential resonant frequencies are avoided during operation of the power inverter without repeatedly testing and/or diagnosing the system and configuring the power inverter before each time the vehicle is operated.

BRIEF SUMMARY

A method is provided for detecting a resonance on a bus coupled to an inverter module. The method comprises generating a first signal on the bus with a first frequency and sweeping the first signal from the first frequency to a second frequency. A second signal, which may be influenced by a characteristic of a component coupled to the bus, is obtained from the bus during the sweep of the first signal from the first frequency to the second frequency. The method further comprises determining a resonant frequency based on the first signal and the second signal and updating the inverter module such that the resonant frequency is not used as a switching frequency for the inverter module.

An apparatus is provided for an inverter module. The inverter module comprises a bus bar arrangement configured to be coupled to a bus and a current sensing element coupled to the bus bar arrangement. The current sensing element is configured to obtain an electric current signal from the bus bar arrangement. A controller is coupled to the bus bar arrangement and the current sensing element. The controller and the current sensing element are cooperatively configured to generate a voltage signal on the bus and sweep the frequency of the voltage signal from a first frequency to a second frequency, wherein the electric current signal obtained by the current sensing element is influenced by the frequency of the voltage signal. The controller and the current sensing element are cooperatively configured to identify a resonant frequency based on the voltage signal and the current signal and update a control scheme for the inverter module based on the resonant frequency.

In another embodiment, an apparatus is provided for an electrical system in a vehicle. The electrical system comprises an energy source, a bus coupled to the energy source, an auxiliary component coupled to the bus, and an inverter module coupled to the bus. A signal generation module is coupled to the bus, and the signal generation module is configured to generate an injection signal on the bus and sweep the frequency of the injection signal from a first frequency to a second frequency. A signal detection module is coupled to the bus, and the signal detection module is configured to obtain a response signal from the bus during the sweep of the injection signal. The response signal may be influenced by a characteristic of the auxiliary component. A control module is coupled to the signal generation module, the signal detection module, and the inverter module, and the control module is configured to determine a resonant frequency based on the injection signal and the response signal and update the inverter module such that the resonant frequency is not used as a switching frequency for the inverter module.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

Techniques and technologies may be described herein in terms of functional and/or logical block components, and with reference to symbolic representations of operations, processing tasks, and functions that may be performed by various computing components or devices. It should be appreciated that the various block components shown in the figures may be realized by any number of hardware, software, and/or firmware components configured to perform the specified functions. For example, an embodiment of a system or a component may employ various integrated circuit components, e.g., memory elements, digital signal processing elements, logic elements, look-up tables, or the like, which may carry out a variety of functions under the control of one or more microprocessors or other control devices.

The following description refers to elements or nodes or features being "connected" or "coupled" together. As used herein, unless expressly stated otherwise, "connected" means that one element/node/feature is directly joined to (or directly communicates with) another element/node/feature, and not necessarily mechanically. Likewise, unless expressly stated otherwise, "coupled" means that one element/node/feature is directly or indirectly joined to (or directly or indirectly communicates with) another element/node/feature, and not necessarily mechanically. Thus, although the figures may depict one exemplary arrangement of elements, additional intervening elements, devices, features, or components may be present in an embodiment of the depicted subject matter. In addition, certain terminology may also be used in the following description for the purpose of reference only, and thus is not intended to be limiting. The terms "first", "second" and other such numerical terms referring to structures do not imply a sequence or order unless clearly indicated by the context.

For the sake of brevity, conventional techniques related to analog circuit design, signaling, sensing, pulse-width modulation (PWM), and other functional aspects of the systems (and the individual operating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter.

Technologies and concepts discussed herein relate generally to systems and methods for detecting a potential resonant frequency on a DC bus caused by frequency characteristics of components coupled to the DC bus. Once a potential resonant frequency is detected, a power inverter is configured to avoid operating with a switching frequency equal to the resonant frequency in order to prevent ripple current from the power inverter from leading to a resonance on the DC bus.

Figure 1:
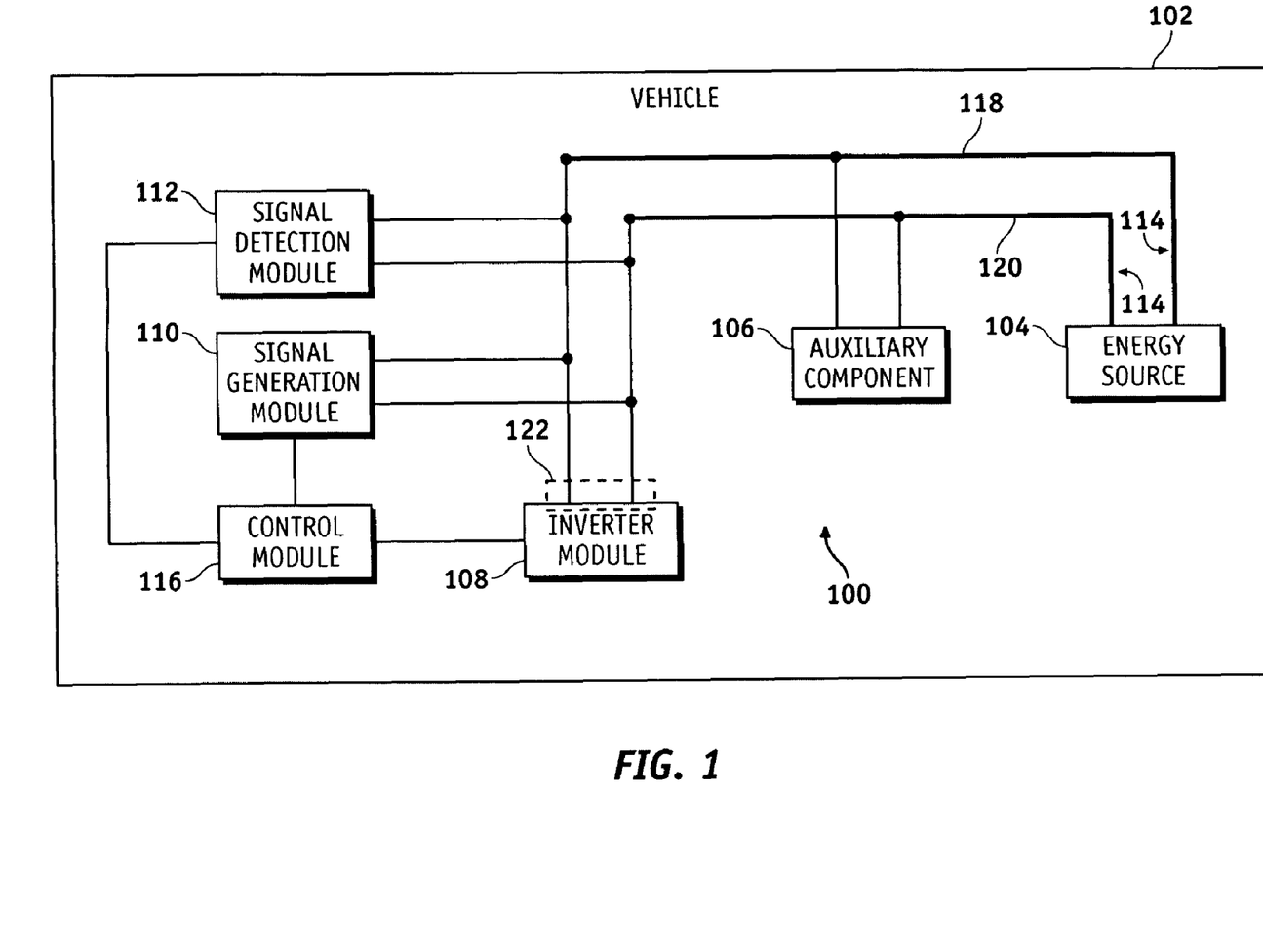
FIG. 1 is a block diagram of an electrical system suitable for use in a vehicle in accordance with one embodiment.

FIG. 1 depicts an electrical system 100 suitable for use in a vehicle 102 in an exemplary embodiment. The electrical system 100 includes, without limitation, an energy source 104, an auxiliary component 106, an inverter module 108, a signal generation module 110, and a signal detection module 112. The various elements of the electrical system 100 are coupled to a bus 114, which may be referred to herein as a voltage bus, a power bus, a common (or shared) bus, or an electrical bus. In an exemplary embodiment, the electrical system 100 further includes a control module 116 suitably configured to support a resonant frequency detection process for detecting a potential resonant frequency on the bus 114, as described in greater detail below. It should be understood that FIG. 1 is a simplified representation of an electrical system 100 for purposes of explanation and is not intended to limit the scope or applicability of the subject matter described herein in any way. In this regard, although FIG. 1 depicts the signal generation module 110, the signal detection module 112, and the control module 116 as distinct elements, in practice, the signal generation module 110, the signal detection module 112, and the control module 116 may be implemented together as an integrated module or integrated into an already existing module, such as inverter module 108 or an electronic control module (ECM).

In an exemplary embodiment, the bus 114 comprises a positive rail 118 and a negative rail 120 and is coupled to the energy source 104 to establish a voltage potential difference between the positive rail 118 and the negative rail 120 in a conventional manner as described below. The auxiliary component 106 is coupled to both rails 118, 120 of the bus 114. An input 122 of the inverter module 108 is coupled to both rails 118, 120 of the bus 114 such that the inverter module 108 and auxiliary component 106 are electrically parallel. In an exemplary embodiment, the signal generation module 110 is coupled to the rails 118, 120 of the bus 114 between the bus 114 and the input 122 of the inverter module 108, and the signal detection module 112 is coupled to the rails 118, 120 of the bus 114 between the signal generation module 110 and the bus 114 as shown. In an exemplary embodiment, the control module 116 is coupled to the inverter module 108, the signal generation module 110, and the signal detection module 112, and the control module 116 is configured to perform the tasks and/or functions as described below.

In an exemplary embodiment the vehicle 102 is realized as an automobile. In alternative embodiments, the vehicle 102 may be any one of a number of different types of automobiles, such as, for example, a sedan, a wagon, a truck, or a sport utility vehicle (SUV), and may be two-wheel drive (2WD) (i.e., rear-wheel drive or front-wheel drive), four-wheel drive (4WD), or all-wheel drive (AWD). The vehicle 102 may also incorporate any one of, or combination of, a number of different types of engines, such as, for example, a gasoline or diesel fueled combustion engine, a "flex fuel vehicle" (FFV) engine (i.e., using a mixture of gasoline and alcohol), a gaseous compound (e.g., hydrogen and natural gas) fueled engine, a combustion/electric motor hybrid engine, and an electric motor. In alternative embodiments, the vehicle 102 may be a plug-in hybrid vehicle, a fully electric vehicle, a fuel cell vehicle (FCV), or another suitable alternative fuel vehicle.

In an exemplary embodiment, the energy source 104 (or power source) is capable of providing a direct current (DC) voltage to the bus 114. Depending on the embodiment, the energy source 104 may be realized as a battery, a fuel cell, a rechargeable high-voltage battery pack, an ultracapacitor, or another suitable energy source. In an exemplary embodiment, the positive rail 118 and the negative rail 120 are each configured to be coupled to a corresponding positive output (or terminal) and negative output (or terminal) of the energy source 104 to establish a voltage potential difference between the positive rail 118 and the negative rail 120 in a conventional manner. In an exemplary embodiment, the electrical system 100 is configured such that the bus 114 comprises a high-voltage bus. It should be understood that the phrase "high-voltage" as used herein generally refers to voltage levels or voltage ratings of greater than 60 volts DC (or 30 volts AC). For example, the bus 114 may have a nominal voltage range from about 200 volts to 550 volts. In this regard, a DC-to-DC converter (or boost converter) may be coupled between the energy source 104 and the bus 114 to establish the desired voltage on the bus 114 depending on the needs of a particular implementation, as will be appreciated in the art.

Depending on the embodiment, the auxiliary component 106 may be realized as an auxiliary power module, an air compressor module, a DC-to-DC converter (or boost converter), a power steering motor driver, or another suitable auxiliary electrical component. In this regard, the auxiliary component 106 may receive DC voltage from and/or provide DC voltage to the bus 114. In an exemplary embodiment, the auxiliary component 106 has a ripple current rating (or tolerance). In this regard, the auxiliary component 106 may comprise an input filter (e.g., one or more input capacitors and/or inductors) configured to minimize ripple current (or voltage) generated by the component and establish an input impedance for the auxiliary component 106 such that the ripple current rating of the input filter is not exceeded when the auxiliary component 106 is coupled to the bus 114 during normal operation, as will be appreciated in the art. As such, the input impedance of the auxiliary component 106 may vary with respect to frequency depending on the particular combination of electrical circuit elements (e.g., the input capacitors and/or inductors) that comprise the input filter of auxiliary component 106. It should be understood that although FIG. 1 depicts a single auxiliary component 106, in practice, the electrical system 100 may comprise a plurality of auxiliary components 106, as will be appreciated in the art.

In an exemplary embodiment, the inverter module 108 includes a power inverter configured to convert the DC power from the bus 114 into AC power for driving an electric motor or vehicle traction system in a conventional manner, as will be appreciated in the art. As described in greater detail below, the inverter module 108 includes one or more phase legs coupled between the positive rail 118 and the negative rail 120 of the bus 114, wherein switches of the phase leg are modulated (opened or closed) at a particular switching frequency to produce an AC voltage across the windings of an electric motor. In an exemplary embodiment, the inverter module 108 includes a controller configured to vary the switching frequency of the pulse width modulation (PWM) commands used to modulate the switches of the inverter phase leg, for purposes of optimizing the efficiency of the inverter module 108, as described in greater detail below. Various methods and/or techniques for utilizing variable switching frequencies for purposes of optimizing the performance of power inverters are well known, and as such, in the interest of brevity, these methods and/or techniques will only be mentioned briefly herein or omitted entirely without providing the well known details.

In an exemplary embodiment, the signal generation module 110 generally represents the hardware, software, and/or firmware components (and various combinations thereof) configured to generate an injection signal on the bus 114 and sweep the injection signal from a first frequency to a second frequency, as described in greater detail below. Depending on the embodiment, the signal generation module 110 may be realized as a variable frequency sine wave generator, which can be implemented using a discrete circuit oscillator or a microcontroller suitably configured to generate a continuous wave output. The injection signal produces a corresponding response signal on the bus 114, and the response signal is influenced by the injection signal and the frequency characteristics (or frequency dependencies) of the various components 106 coupled to the bus 114, as will be appreciated in the art and described in greater detail below.

In an exemplary embodiment, the signal detection module 112 generally represents the hardware, software, and/or firmware components (and various combinations thereof) configured to measure, sense, or otherwise obtain the response signal and provide the obtained response signal to the control module 116 as described in greater detail below. In an exemplary embodiment, the signal detection module 112 is realized as using analog acquisition circuitry comprising a suitably configured combination of transducers (e.g., current and/or voltage transducers) and analog-to-digital converters (ADCs). Conventional methods and/or means for obtaining or measuring signals are well known, and so, in the interest of brevity, will only be mentioned briefly herein or omitted entirely without providing the well known details. Although FIG. 1 depicts the signal generation module 110 and signal detection module 112 as separate elements coupled to the bus 114 electrically parallel to the inverter module 108, in various alternative embodiments, the features, functions, and/or hardware embodied by the signal generation module 110 and/or signal detection module 112 may be may be integral with (or incorporated) in the inverter module 108 and/or the control module 116, as described in greater detail below.

In an exemplary embodiment, the control module 116 may be implemented or realized with a general purpose processor, a content addressable memory, a digital signal processor, an application specific integrated circuit, a field programmable gate array, any suitable programmable logic device, discrete gate or transistor logic, discrete hardware components, or any combination thereof, designed to perform the functions described herein. In this regard, the control module 116 may be realized as a microprocessor, a controller, a microcontroller, a state machine, or the like. The control module 116 may also be implemented as a combination of computing devices, e.g., a combination of a digital signal processor and a microprocessor, a plurality of microprocessors, one or more microprocessors in conjunction with a digital signal processor core, or any other such configuration. In practice, the control module 116 includes processing logic that may be configured to carry out the functions, techniques, and processing tasks associated with the operation of the electrical system 100, as described in greater detail below. Furthermore, the steps of a method or algorithm described in connection with the embodiments disclosed herein may be embodied directly in hardware, in firmware, in a software module executed by the control module 116, or in any practical combination thereof.

In an exemplary embodiment, the control module 116 is configured to identify or determine a resonance on the bus 114 (or the corresponding resonant frequency) caused by a change in the input impedance of the auxiliary component 106 with respect to frequency, as described in greater detail below. In an exemplary embodiment, the control module 116 identifies or determines a resonant frequency based on the injection signal generated by the signal generation module 110 and the response signal obtained by the signal detection module 112. In response to identifying a resonant frequency, the control module 116 updates or otherwise configures the inverter module 108 such that the resonant frequency is not used as a switching frequency for the phase legs of the inverter module 108, as described in greater detail below. Although FIG. 1 depicts the control module 116 and the inverter module 108 as distinct and separate elements, in practice, the control module 116 may be integral with (or incorporated) in the inverter module 108. For example, the features and functionality of the control module 116 may be integrated or incorporated into an existing controller within the inverter module 108.

Figure 2:
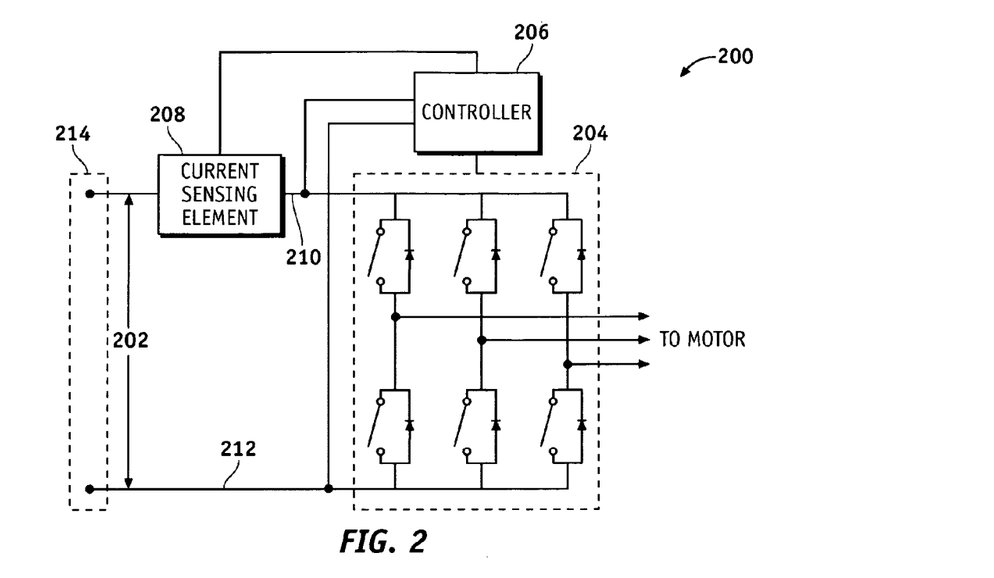
FIG. 2 is a schematic diagram of an exemplary inverter module suitable for use with the electrical system of FIG. 1 in accordance with one embodiment.

Referring now to FIG. 2, in an exemplary embodiment, an inverter module 200 suitable for use in the electrical system 100 of FIG. 1 includes, without limitation, a bus bar arrangement 202, a power inverter 204, a controller 206, and a current sensing element 208. It should be appreciated that FIG. 2 is a simplified representation of an inverter module 200 and is not intended to limit the scope of the subject matter in any way.

In an exemplary embodiment, the bus bar arrangement 202 comprises a positive rail (or positive bus bar) 210 and a negative rail (or (negative bus bar) 212. The input 214 of the inverter module 200 is configured to be coupled to a system bus (e.g., bus 114) such that the positive rail 210 receives or otherwise establishes a positive DC voltage potential and the negative rail 212 receives or otherwise establishes a negative DC voltage potential. For example, the positive rail 210 of the bus bar arrangement 202 may be coupled to a positive rail 118 of the system bus 114 and the negative rail 212 of the bus bar arrangement 202 may be coupled to a negative rail 120 of the system bus 114 in a conventional manner, as will be appreciated in the art.

In the illustrated embodiment, the power inverter 204 comprises a plurality of switches (e.g., semiconductor devices, such as transistors and/or switches) with antiparallel diodes (i.e., diodes which are antiparallel to each switch), coupled between the positive rail 210 and the negative rail 212 and arranged into inverter phase legs, as will be appreciated in the art. As shown, the power inverter 204 comprises three inverter phase legs. The output of the power inverter 204 (e.g., the midpoint of the inverter phase legs) may be coupled to a motor, such that modulation (e.g., opening and closing) of the switches in the power inverter 204 creates an alternating current (AC) voltage across windings of the motor, as will be understood.

In an exemplary embodiment, the controller 206 is in operable communication and/or electrically coupled to the power inverter 204. The controller 206 is responsive to commands received from the driver of the vehicle (e.g., via an accelerator pedal) and determines a desired torque output for a motor coupled to the power inverter 204. The controller 206 generates or otherwise provides signals to modulate the switches within the inverter phase legs such that the output AC voltage of the power inverter 204 operates a motor with the desired torque output, as will be appreciated in the art. In an exemplary embodiment, the controller 206 generates high frequency pulse width modulation (PWM) signals (or PWM commands) such that the power inverter 204 is operated at a particular switching frequency (e.g., the switches of power inverter 204 are modulated at the particular switching frequency) based on a predefined control scheme, as will be appreciated in the art. As used herein, a control scheme should be understood as referring to the particular methods, algorithms, techniques, or other processes used by the inverter module 200 and/or controller 206 to determine the switching frequency for modulating the inverter phase legs. Various methods and/or techniques for generating PWM signals are well known, and so, in the interest of brevity, will only be mentioned briefly herein or omitted entirely without providing the well known details. The power inverter 204 generates a ripple current having a frequency equal to the particular switching frequency of the PWM signals (or PWM commands), as will be appreciated in the art.

In an exemplary embodiment, the controller 206 is coupled between the positive rail 210 and the negative rail 212 of the bus bar arrangement 202. In this regard, although not illustrated, the controller 206 and the bus bar arrangement 202 may be coupled via isolation circuitry or other elements suitably configured to provide voltage isolation such that the controller 206 is not exposed to a high-voltage that may be present on the bus bar arrangement 202, as will be appreciated in the art. As described in greater detail below, in an exemplary embodiment, the controller 206 is configured to generate an injection voltage signal the bus (e.g., bus 114) coupled to the bus bar arrangement 202 and sweep the voltage signal from a first frequency to a second frequency, as described in greater detail below.

In the illustrated embodiment, the current sensing element 208 is coupled to the bus bar arrangement 202 between the input 214 of the inverter module 200 and the controller 206. As shown, the current sensing element 208 is inline with the positive rail 210 such that it is coupled between the input 214 of the inverter module 200 and the controller 206. In alternative embodiments, the current sensing element 208 may be inline with the negative rail 212 or separated from the bus bar arrangement 202 (e.g., as shown in FIG. 1 for signal detection module 112). The current sensing element 208 is configured to measure, sense, or otherwise obtain a current signal flowing from the controller 206 and traveling through the bus bar arrangement 202 and out of the input 214 to the inverter module 200 as a result of the injection voltage signal, as described in greater detail below. The current sensing element 208 may be realized as any number of hardware, software, and/or firmware components configured to obtain and/or measure the current through a rail 210, 212 of the bus bar arrangement 202. In an exemplary embodiment, the current sensing element 208 obtains the current through the bus bar arrangement 202 during the sweep of the injection voltage signal from the first frequency to the second frequency, and provides the obtained current signal to the controller 206. The controller 206 analyzes the relationship between the injection voltage signal and the current signal that occurs in response to the injection voltage signal, and determines or identifies a resonance (or resonant frequency) on the system bus (e.g., bus 114) coupled to the bus bar arrangement 202, as described in greater detail below.

Figure 3:
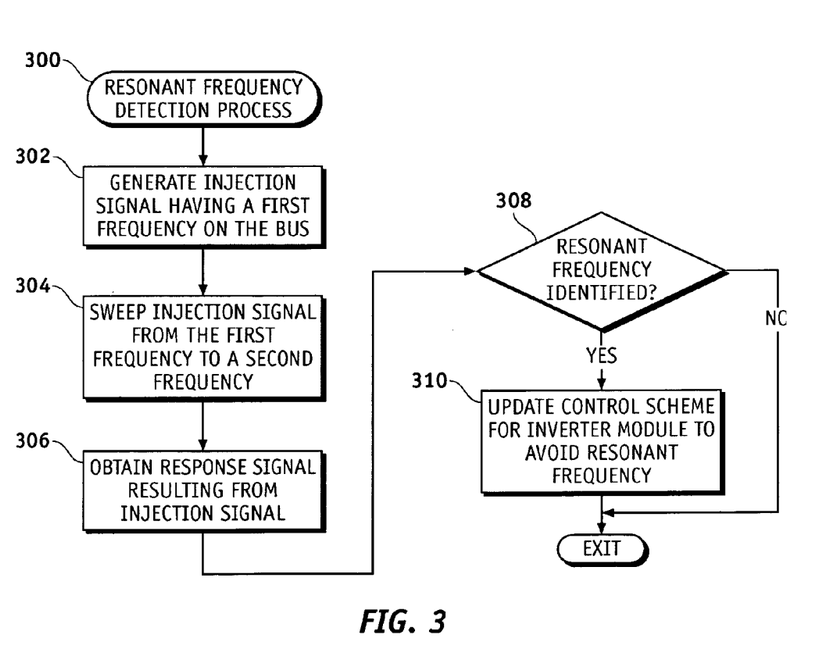
FIG. 3 is a flow diagram of a resonant frequency detection process suitable for use with the electrical system of FIG. 1 in accordance with one embodiment.

Referring now to FIG. 3, in an exemplary embodiment, an electrical system may be configured to perform a resonant frequency detection process 300 and additional tasks, functions, and operations described below. The various tasks may be performed by software, hardware, firmware, or any combination thereof. For illustrative purposes, the following description may refer to elements mentioned above in connection with FIGS. 1-2. In practice, the tasks, functions, and operations may be performed by different elements of the described system, such as the inverter module 108, 200, the signal generation module 110, the signal detection module 112, the controller 206, or the current sensing element 208. It should be appreciated any number of additional or alternative tasks may be included, and may be incorporated into a more comprehensive procedure or process having additional functionality not described in detail herein.

Referring again to FIG. 3, and with continued reference to FIG. 1 and FIG. 2, the resonant frequency detection process 300 may be performed to detect or determine one or more resonant frequencies that may occur on an electrical bus (e.g., bus 114) as a result of various frequency dependent characteristics of the input impedances of the various components that may be coupled to the electrical bus. Depending on the embodiment, the resonant frequency detection process 300 may be initiated in response to a signal or command from a vehicle control module (i.e., an electronic control unit or ECU), or in response to detecting the presence of an energy source or power supply (e.g., energy source 104) coupled to the bus. Alternatively, the resonant frequency detection process 300 may initialize when an inverter module is initially coupled to the bus. In an exemplary embodiment, the resonant frequency detection process 300 is performed before a motor in a vehicle begins operation, such that the switches of the power inverter 204 are open and the power inverter 204 functions as an open circuit during execution of the resonant frequency detection process 300, as will be appreciated in the art. In this manner, the resonant frequency detection process 300 may be performed each time before a vehicle is operated to dynamically and adaptively configure the inverter module 108, 200 and/or controller 206 to avoid operating at potential resonant frequencies, as described in greater detail below.

In an exemplary embodiment, the resonant frequency detection process 300 begins by generating an injection signal having a first frequency on the bus (task 302). In this regard, the injection signal is an alternating current (AC) signal having a predetermined frequency such that the injection signal effectively simulates an AC ripple current. Because the bus (e.g., bus 114) is primarily a DC bus, the AC injection signal will produce a corresponding AC response signal on the bus that may be obtained, measured, or otherwise identified, as described in greater detail below. In an exemplary embodiment, the first frequency represents and endpoint of the range of potential switching frequencies for the particular inverter module (or power inverter) coupled to the bus. For example, the switching frequency of a power inverter 204 in an inverter module 108, 200 may range from four kilohertz to twelve kilohertz during operation. In this regard, the first frequency may be chosen to be either four kilohertz or twelve kilohertz, such that it represents an endpoint of the range of potential switching frequencies. Depending on the embodiment, the injection signal may be implemented as a current signal or a voltage signal.

In an exemplary embodiment, the injection signal comprises a small-signal voltage or small-signal current, that is, the magnitude of the injection signal is chosen to be a small value relative to the nominal signal levels on the bus such that the magnitude of the injection signal on the operation of the various components coupled to the bus is negligible. For example, in accordance with one embodiment, the controller 206 within the inverter module 200 may generate the injected signal by generating a voltage signal (e.g., a voltage potential difference between rails 210, 212) having a magnitude (or amplitude) of one volt and a frequency of four kilohertz. Alternatively, in accordance with another embodiment, the control module 116 may instruct, indicate, or otherwise cause the signal generation module 110 to generate a voltage signal on the bus 114 (e.g., a voltage potential difference between rails 118, 120) having a magnitude (or amplitude) of one volt and a frequency of four kilohertz. It should be understood that although the resonant frequency detection process 300 may be described herein in the context of a voltage signal as the injection signal, the resonant frequency detection process 300 may be implemented in a similar manner using a current signal as the injection signal, as will be appreciated in the art.

In an exemplary embodiment, the resonant frequency detection process 300 continues by sweeping the injection signal from the first frequency to a second frequency (task 304). In an exemplary embodiment, the second frequency represents an endpoint of the range of potential switching frequencies for the particular inverter module (or power inverter) such that the second frequency corresponds to the endpoint of the range of potential frequencies that is opposite the first frequency. For example, if the range of potential switching frequencies for the inverter module is from four kilohertz to twelve kilohertz and the first frequency is chosen to be four kilohertz, then the second frequency may be chosen as twelve kilohertz, thereby representing the opposing endpoint of the range of potential switching frequencies.

In an exemplary embodiment, the resonant frequency detection process 300 performs a frequency sweep with the injection signal by maintaining the magnitude (or amplitude) of the injection signal at a constant level and sweeping the frequency of the injection signal from the first frequency to the second frequency. In this regard, the frequency of the injection signal may be smoothly and continuously adjusted from the first frequency to the second frequency at a constant rate, as will be appreciated in the art. For example, the controller 206 and/or signal generation module 110 may generate a voltage signal having a magnitude of one volt and sweep the frequency of the voltage signal from four kilohertz to twelve kilohertz. In an alternative embodiment, the resonant frequency detection process 300 may sweep the frequency of the injection signal by incrementally adjusting the frequency of the injection signal at a fixed interval. For example, the controller 206 and/or signal generation module 110 may generate a voltage signal having a magnitude of one volt and incrementally increase the frequency of the voltage signal from four kilohertz to twelve kilohertz at one hundred hertz intervals.

In an exemplary embodiment, the resonant frequency detection process 300 continues by obtaining (or measuring) the response signal on the bus resulting from the injection signal (task 306). For example, if a small AC voltage signal is injected on the bus, an AC current signal resulting from the AC voltage signal may be measured, obtained, or otherwise identified on the bus. The magnitude (or amplitude) and/or the phase of the response signal will be influenced by frequency characteristics (or frequency dependencies) of the various components coupled to the bus as the frequency of the injection signal changes during the sweep of the injection signal from the first frequency to the second frequency, as will be appreciated in the art and described in greater detail below. In this manner, the response signal is influenced by the frequency of the injection signal. In an exemplary embodiment, the current sensing element 208 and/or signal detection module 112 obtains or measures the response signal (e.g., an electrical current signal) and provides information pertaining to the response signal (e.g., the magnitude and/or phase) the controller 206 and/or control module 116 for further analysis. In accordance with one embodiment, if the frequency of the injection signal is incrementally adjusted, the response signal is measured or obtained for each frequency increment between the first frequency to the second frequency.

In an exemplary embodiment, the resonant frequency detection process 300 continues by determining whether a resonant frequency exists on the bus based on the relationship between the injection signal and the response signal (task 308). In this regard, the resonant frequency detection process 300 analyzes the relationship between the injection signal and the response signal to determine whether a component (or the overall configuration of components) coupled to the bus may cause resonance on the bus at a particular frequency within the range of potential switching frequencies for the inverter module. For example, an auxiliary component 106 coupled to the bus 114 may comprise one or more input capacitors and/or inductors, and as a result, the input impedance of the auxiliary component 106 will vary with frequency, as will be appreciated in the art. As a result, the effective impedance seen from the input 122, 214 of the inverter module 108, 200 (or by the controller 206 and/or signal generation module 110) may increase or decrease as the frequency of the injection signal changes, thereby producing a corresponding change in the magnitude and/or phase of the response signal.

In accordance with one embodiment, the resonant frequency detection process 300 determines or identifies a resonant frequency by calculating an input impedance based on the injection signal and the response signal. In this regard, the calculated input impedance represents the effective impedance of the bus 114 from the input 122, 214 of the inverter module 108, 200. For example, the resonant frequency detection process 300 may divide the injected voltage signal (e.g., the voltage signal generated by the controller 206 and/or signal generation module 110) by the response current signal (e.g., the current signal obtained by the current sensing element 208 and/or signal detection module 112). The resonant frequency detection process 300 may then identify the resonant frequency by analyzing variances in the magnitude and/or phase of the input impedance with respect to frequency. In accordance with one embodiment, the resonant frequency detection process 300 performs a Fourier analysis (e.g., a fast Fourier transform or FFT) on the input impedance to obtain a resonant frequency for the bus. In another embodiment, the resonant frequency detection process 300 may determine or identifying a resonant frequency using pattern recognition. For example, in the absence of a resonant frequency, the attenuation of the response signal relative to the injection signal increases as the frequency of the injection signal increases. However, if a resonant frequency exists, a sudden peak (or decrease in attenuation) occurs near the resonant frequency. A fast Fourier analysis may be used to analyze the frequency content of the injection signal and response signal and construct a pattern, which is subsequently compared to a reference pattern representing an electrical system that does not have a resonant frequency. Although the subject matter may be described herein in the context of a single resonant frequency, in practical embodiments, a plurality of resonant frequencies may exist on the bus for a given implementation, and the resonant frequency detection process 300 may be adapted to accommodate multiple resonant frequencies, as will be appreciated in the art.

In an exemplary embodiment, if the resonant frequency detection process 300 identifies a resonant frequency on the bus, the resonant frequency detection process 300 continues by updating the control scheme for the inverter module in order to avoid utilizing the resonant frequency as a switching frequency (task 310). The control scheme is updated such that the resonant frequency is not used as a switching frequency for the inverter module 108, 200 during subsequent operation, and thereby reduces the possibility that the inverter module will produce a ripple current at the resonant frequency, which could otherwise potentially cause the ripple current ratings for one or more components to be exceeded. In other words, the resonant frequency detection process 300 configures or updates the controller 206 and/or inverter module 108, 200 such that the switching frequency used for modulating the inverter phase legs 204 during subsequent operation will not be equal to the resonant frequency. In an exemplary embodiment, after appropriately updating the control scheme and configuring the controller 206 and/or the inverter module 108, 200 to avoid the resonant frequency as a switching frequency, the resonant frequency detection process 300 exits and the electrical system and/or inverter module may proceed with normal operations.

To briefly summarize, one advantage of the system and/or method described above is that potential resonant frequencies may be dynamically identified, and thereby, the inverter module may be dynamically configured to accommodate for changes in other components coupled to (or sharing) the DC bus. By enabling adaptive frequency selection for the inverter module, the systems and/or methods provide enhanced protection of auxiliary components against potentially harmful bus resonances that may be caused by changes in component tolerances, aging, and other updates or modifications to the electrical system.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:
1. A method for detecting a resonance on a bus, the bus being coupled to a first component and an inverter module, the method comprising:
    generating a first signal on the bus, the first signal having a first frequency;
    sweeping the first signal from the first frequency to a second frequency;
    obtaining a second signal from the bus during the sweep of the first signal from the first frequency to the second frequency, the second signal being influenced by a characteristic of the first component;
determining a resonant frequency within a range of potential switching frequencies for the inverter module based on the first signal and the second signal; and
updating the inverter module such that the resonant frequency is not used as a switching frequency for the inverter module during subsequent operation.

2. The method of claim 1, wherein:
generating the first signal on the bus comprises generating a voltage signal on the bus;
sweeping the first signal comprises sweeping a frequency of the voltage signal from the first frequency to the second frequency; and
obtaining the second signal comprises obtaining an electric current signal on the bus in response to sweeping the frequency of the voltage signal from the first frequency to the second frequency.

3. The method of claim 2, wherein sweeping the frequency of the voltage signal from the first frequency to the second frequency comprises incrementally adjusting the frequency of the voltage signal from the first frequency to the second frequency.

4. The method of claim 3, wherein obtaining the electric current signal on the bus comprises measuring a current on the bus for each frequency increment from the first frequency to the second frequency.

5. The method of claim 2, wherein determining the resonant frequency comprises:
calculating an input impedance based on the voltage signal and the electric current signal; and
identifying the resonant frequency based on the input impedance.

6. The method of claim 5, wherein identifying the resonant frequency comprises analyzing the input impedance to obtain the resonant frequency.

7. The method of claim 6, wherein analyzing the input impedance comprises performing a Fourier analysis on the input impedance.

8. The method of claim 7, the inverter module comprising a controller, wherein updating the inverter module comprises updating a control scheme for the controller such that a switching frequency for a phase leg of the inverter module is not equal to the resonant frequency.

9. The method of claim 1, wherein updating the inverter module comprises updating a control scheme for the inverter module such that the resonant frequency is not used as a switching frequency for the inverter module.

10. An inverter module comprising:
a bus bar arrangement configured to be coupled to a bus;
a current sensing element coupled to the bus bar arrangement, the current sensing element being configured to obtain an electric current signal from the bus bar arrangement; and
a controller coupled to the bus bar arrangement and the current sensing element, wherein the controller and the current sensing element are cooperatively configured to:
generate a voltage signal on the bus, the voltage signal having a frequency;
sweep the frequency of the voltage signal from a first frequency to a second frequency, wherein the electric current signal obtained by the current sensing element is influenced by the frequency of the voltage signal;
identify a resonant frequency within a range of potential switching frequencies based on the voltage signal and the electric current signal; and
update a control scheme for the inverter module based on the resonant frequency such that a switching frequency of the inverter module is not equal to the resonant frequency during subsequent operation.

11. The inverter module of claim 10, further comprising a power inverter coupled to the bus bar arrangement and the controller, wherein the controller is configured to operate the power inverter at a switching frequency based on the control scheme.

12. The inverter module of claim 10, wherein the controller is configured to:
incrementally adjust the frequency of the voltage signal from the first frequency to the second frequency; and
obtain the electric current signal on the bus for each frequency increment from the first frequency to the second frequency.

13. The inverter module of claim 10, wherein the controller is configured to identify the resonant frequency by:
calculating an impedance based on the voltage signal and the electric current signal; and
analyzing the impedance to identify the resonant frequency.

14. The inverter module of claim 10, wherein the controller is configured to sweep the frequency of the voltage signal from four kilohertz to twelve kilohertz.

15. The inverter module of claim 10, wherein:
the first frequency corresponds to a first endpoint of the range of potential switching frequencies; and
the second frequency corresponds to a second endpoint of the range of potential switching frequencies.

16. An electrical system in a vehicle, the electrical system comprising:
an energy source;
a bus coupled to the energy source;
an auxiliary component coupled to the bus;
an inverter module coupled to the bus;
a signal generation module coupled to the bus, the signal generation module being configured to:
generate an injection signal on the bus, the injection signal having a frequency; and
sweep the frequency of the injection signal from a first frequency to a second frequency;
a signal detection module coupled to the bus, the signal detection module being configured to obtain a response signal from the bus during the sweep of the injection signal, the response signal being influenced by a characteristic of the auxiliary component; and
a control module coupled to the signal generation module, the signal detection module, and the inverter module, wherein the control module is configured to:
determine a resonant frequency within a range of potential switching frequencies for the inverter module based on the injection signal and the response signal; and
update the inverter module such that the resonant frequency is not used as a switching frequency for the inverter module during subsequent operation.

17. The electrical system of claim 16, wherein the signal generation module is configured to:
generate a voltage signal on the bus; and
sweep the frequency of the voltage signal from the first frequency to the second frequency.

18. The electrical system of claim 17, wherein the signal detection module is configured to obtain an electric current signal on the bus in response to sweeping the frequency of the voltage signal from the first frequency to the second frequency.

19. The electrical system of claim 16, wherein the control module is configured to:
   calculate an input impedance based on the injection signal and the response signal; and
   identify the resonant frequency based on the input impedance.

20. The electrical system of claim 16, wherein the signal generation module is configured to sweep the frequency of the injection signal from four kilohertz to twelve kilohertz.

* * * * *